United States Patent [19]
Nguyen et al.

[11] Patent Number: 5,788,870
[45] Date of Patent: Aug. 4, 1998

[54] PROMOTION OF THE ADHESION OF FLUOROCARBON FILMS

[75] Inventors: Thao Ngoc Nguyen, Katonah; Gottlieb Stefan Oehrlein, Yorktown Heights; Zeev Avraham Weinberg, White Plains, all of N.Y.

[73] Assignee: International Business Machines Corporation, Armonk, N.Y.

[21] Appl. No.: 559,766

[22] Filed: Nov. 15, 1995

Related U.S. Application Data

[63] Continuation of Ser. No. 693,734, Apr. 30, 1991, abandoned.

[51] Int. Cl.$^6$ ............................................. B44C 1/22
[52] U.S. Cl. .................. 216/63; 156/272.6; 216/34; 216/67
[58] Field of Search .................. 216/34, 35, 63, 216/67; 156/272.6

[56] References Cited

U.S. PATENT DOCUMENTS

| | | | |
|---|---|---|---|
| 3,656,995 | 4/1972 | Reedy, Jr. | 117/69 |
| 3,774,703 | 11/1973 | Sanderson | 428/626 |
| 4,264,642 | 4/1981 | Ferralli | 427/38 |
| 4,524,089 | 6/1985 | Haque | 427/38 |
| 4,528,066 | 7/1985 | Merkling, Jr. et al. | 204/192.37 |
| 4,565,710 | 1/1986 | Singer | 427/35 |
| 4,735,996 | 4/1988 | Nagai et al. | 428/422 |
| 4,743,327 | 5/1988 | Dehaan et al. | 156/272.6 |

OTHER PUBLICATIONS

Handbook of Chemistry and Physics, 57$^{th}$ Ed. 7 pg E–60.
Chapman, Brian "Glow Discharge Processes", (John Wiley and Sons), NY 1980 pp. 278–283.
Chapman, "Glow Discharge Processes," RF Charges, 1980, John Wiley & Sons, Inc., pp. 143–146.
D.W. Rice, et al., "Glow Discharge Polymerization of Tetrafluoroethylene, 1,1, difluoroethylene, and chlorotrifluoroethylene," J. Electrochem. Soc., Sep. 1976, pp. 1308–1312.
Anderson, et al., "Electron Donor–Acceptor Properties of Thin Polymer Films on Silicon. II. Tetrafluroethylene Polymerized by RF Flow Discharge Techniques," Journal of Polymer Science, vol. 879–895 (1976).

*Primary Examiner*—William Powell
*Attorney, Agent, or Firm*—Pollock, Vande, Sande & Priddy

[57] ABSTRACT

The adhesion between a polymeric fluorocarbon film and a substrate is improved by providing a non-volatile carbide-forming metallic layer intermediate the substrate and the polymeric fluorocarbon film, and exposing the substrate to ion-bombardment in a noble gas/polymerizing gas atmosphere prior to providing the fluorocarbon films.

17 Claims, 1 Drawing Sheet

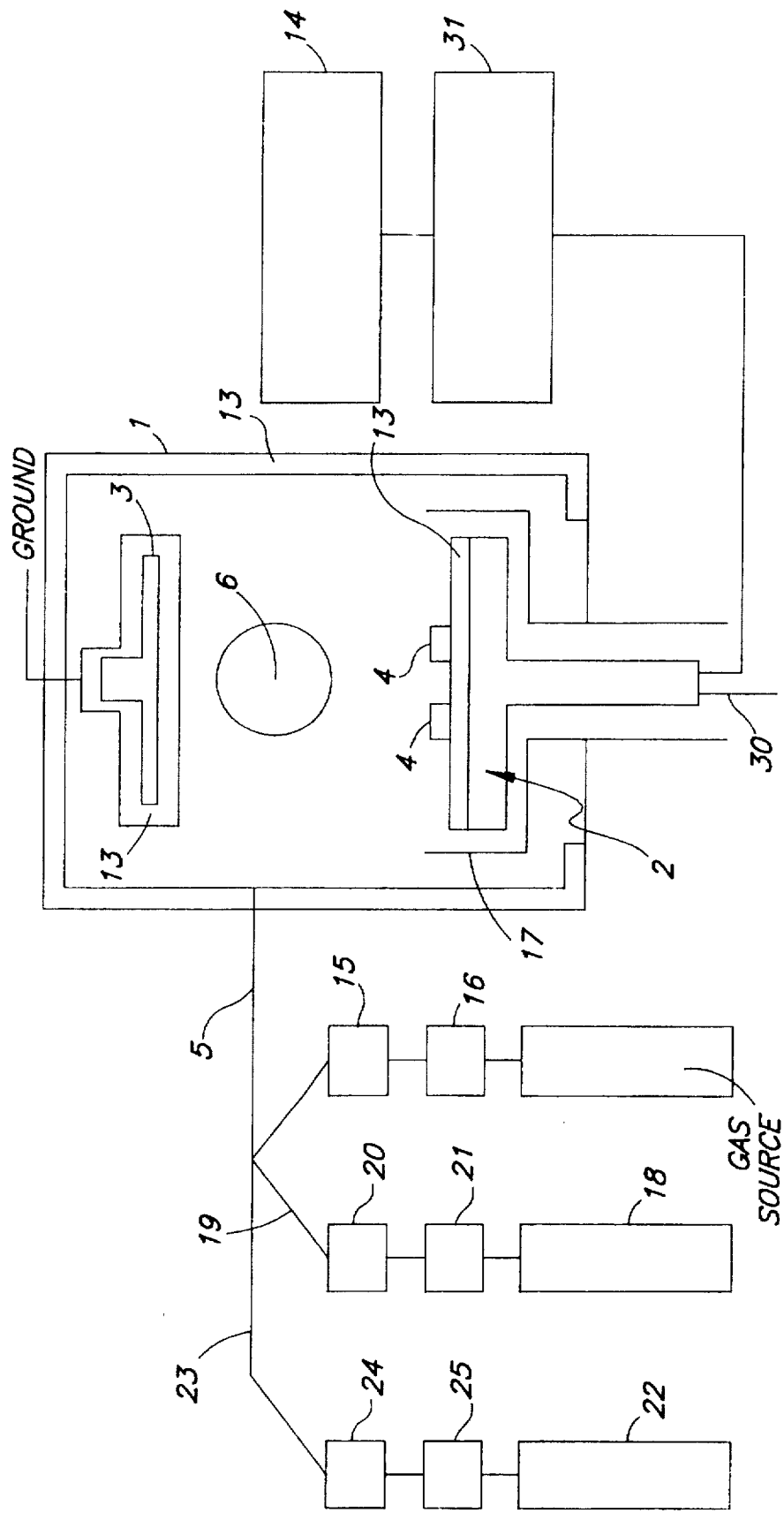

PROMOTION OF THE ADHESION OF FLUOROCARBON FILMS

This application is a continuation of application Ser. No. 07/693,734 filed on Apr. 30, 1991, now abandoned.

TECHNICAL FIELD

The present invention is concerned with improving the adhesion of a polymeric fluorocarbon film to a substrate. The present invention is particularly advantageous for promoting adhesion between a polymeric fluorocarbon dielectric or insulating layer in integrate circuits and to a substrate. The present invention is especially suitable for promoting the adhesion between plasma deposited polymeric fluorocarbon films onto certain metallic substrates.

BACKGROUND ART

In advanced microelectronic chips, that structure referred to as back-end-of-line (BEOL) metallization requires several layers of metal interconnections that are separated by a dielectric. Presently, the dielectric typically employed is fabricated of sputtered quartz which has a dielectric constant of about 3.9. However, in order to reduce signal delays in future chips, it will become necessary to reduce the dielectric constant of the insulator so that the capacitance between metal levels will be reduced. Much effort is now involved in attempting to replace the quartz with various polyimides. Polyimides generally have a dielectric constant of at least about 2.8 and are deposited onto the chip by wet spin-on techniques followed by subsequent drying at elevated temperatures. However, wet-processing, spin-on and drying techniques are desirable from a standpoint of reproduceability and from an environmental viewpoint in view of the volatile organic solvents required.

Halogenated polymeric materials such as poly (tetrafluoroethylene) (PTFE) are attractive candidates for advanced electronic packaging applications because of their very low dielectric constants, excellent chemical stability, low solvents/moisture absorption and excellent thermal stability. However, because of their relative chemical inertness and hydrophobic nature, these halogenated polymeric materials are difficult to process into electronic packaging structures. The lack of effective processing techniques has inhibited the exploitation of these materials by the electronics industry. The low surface energy of these materials gives the inability to adhere to other surfaces and must be effectively overcome to yield desirable metal adhesion for practical electronic packaging applications.

More recently, as described in copending U.S. Pat. application Ser. No. 07/693,736 (DOCKET NO. Y0989-053) filed concurrently herewith, U.S. Pat. No. 5,244,730, disclosure of which is incorporated herein by reference, a plasma enhanced chemical vapor deposition technique has been provided for the fabrication of polymeric fluorocarbon films that can be used as interlevel insulator between metal line interconnects in integrated circuits. However, even with this new advanced technique, adhesion to various substrates is still not entirely satisfactory.

SUMMARY OF INVENTION

The present invention overcomes the adhesion problem of polymeric fluorocarbon films to other substrates, and makes it possible to provide a tenacious bond between the polymeric fluorocarbon and the underlying substrate.

In particular, the present invention is concerned with a method for adhering a polymeric fluorocarbon film to a substrate which includes coating said substrate with a metal capable of forming carbon-metal bonded non-volatile materials. The coated substrate is exposed to ion-bombardment in a noble gas plasma. The coated substrate is exposed to a mixture of the noble gas and a gaseous polymerizable fluorocarbon to create metal-carbon bonds. The polymeric fluorocarbon film is deposited onto the substrate by exposing the coated substrate to a gaseous polymerizable fluorocarbon in the absence of the nobel gas.

The success of the present invention appears to be based on the formation of non-volatile carbon-metal bonded materials at the interface before the fluorocarbon polymerizes.

In addition, the present invention is concerned with a coated substrate obtained by the above process.

The present invention is also concerned with a coated substrate that comprises the substrate, a non-volatile carbide forming metallic layer on said substrate; a layer of a non-volatile carbon-metal bonded material on said metallic layer; and a polymeric fluorocarbon film adjacent said layer of metal carbide.

SUMMARY OF DRAWING

FIG. 1 is a schematic diagram of apparatus suitable for carrying out the process of the present invention.

PREFERRED AND VARIOUS MODES FOR CARRYING OUT INVENTION

The substrate onto which the polymeric fluorocarbon film is to be deposited is preferably one of those substrates encountered in fabricating integrated circuits which include silicon oxide, silicon nitride and preferably such metals as copper, gold and nickel.

In order to enhance the adhesion between the substrate and a subsequently applied polymeric fluorocarbon film, an interlayer of a non-volatile carbon-metal bonded material is provided. The term "non-volatile" as used herein refers to the material being non-volatile at the temperatures to be encountered upon use of the products made pursuant to the present invention.

In particular, a non-volatile carbide-forming metallic layer such as a refractory metallic carbide-forming material is provided on the substrate. Non-volatile carbide-forming metals include titanium, tungsten, and preferably tantalum. The metal can be deposited by any known technique such as sputtering or evaporation. The metals can be deposited by sputtering, electron-beam evaporation or chemical vapor deposition, preferably in a deposition chamber which has a vacuum transfer capability to move wafers without air exposure to the PECVD chamber.

The metal layer is typically about 0.05 to about 2 microns and preferably about 0.1 to about 0.5 microns thick.

According to preferred aspects of the present invention, the metal surface of the carbide-forming metallic layer can be cleaned and any metal-oxide removed therefrom such as by carrying out a reactive ion etching using a $CF_4$ gas. The reactive ion etching can be carried out in the same type of apparatus described in copending U.S. patent application Ser. No. 07/693,736 (DOCKET NO. Y0989-053), disclosure of which is incorporated herein by reference and illustrated in FIG. 1.

The chamber walls and electrodes as disclosed in said copending U.S. patent application Ser. No. 07/693,736 (DOCKET NO. Y0989-053) are precoated with the fluorocarbon film 13. For instance, the fluorocarbon film 13 can be provided onto the walls of the chamber and electrodes by introducing into the chamber via conduit 5, a gaseous polymerizable fluorocarbon.

The chamber prior to introduction of the gas can be evacuated through vacuum coupling 6. The flow of the gas can controlled by valve 15 and measured by linear mass flow meter 16.

The gaseous polymerizable fluorocarbon introduced into the chamber includes $C_2F_4$, $C_4F_8$, $C_3F_8$, and $C_2F_6$ and preferably is $C_2F_4$. The gaseous fluorocarbon is typically fed into the chamber at a rate of about 20 to about 150 standard cubic centimeters per minute (sccm) and preferably at about 100 sccm which corresponds to a residence time of about 0.9 seconds of the gaseous polymerizable fluorocarbon in a plasma chamber having a volume of about 48 liters. Prior to introduction of the gaseous fluorocarbon into the chamber, the chamber is evacuated, for instance, using a turbo molecular pump to provide a vacuum of at least about $10^{-6}$ torr.

The initial phase in coating the walls and electrodes is carried out in a manner so as to minimize ion bombardment of the first electrode 2 in order to assure against excessive incorporation of impurities into the fluorocarbon film 13. This can be accompanied by employing rf power supplied to the working electrode 2 of about 50 to about 100 watts.

The power density is typically about 0.02 to about 0.05 W per cm² of the working electrode surface are. The pressure during this phase is typically about 100 mTorr to about 200 mTorr and more typically about 200 mTorr. The radio frequency is typically about 1 to about 100 megahertz and more typically 13.56-MHz. The rf power is capacitatively fed to the working electrode using a matching network 31 which includes a DC-blocking capacitor to minimize reflected power. The combination of pressure and power is selected to minimize the self-bias voltage on working electrode 2 to −50 volts or less.

This initial phase of coating the walls and electrode is normally carried out for about 5 to about 10 minutes. After this, the gas pressure is preferably reduced and the rf power is preferably increased, and the self-bias on the electrode 2 is typically increased. In particular, at this phase of coating the walls and electrodes, the amount of rf power that is supplied to the electrode 2 is in the range of about 100 watts to about 1000 watts, preferably about 200 to about 800 watts and most preferably about 200 watts to about 400 watts. The power density is typically about 0.05 to 0.4 W per cm² of the working electrode surface area and more typically about 0.15 W per cm² of the working electrode surface area. The pressure during the deposition is maintained in the range of about 10 to about 180 mTorr and preferably at about 20 to about 100 mTorr and most preferably about 26 mTorr. The radio frequency is typically about 1 to about 100 megahertz and more typically 13.56-MHz.

The rf power is capacitatively fed to the working electrode using a matching network 31 which includes a DC-blocking capacitor to minimize reflected power. The self-bias voltage on the working electrode 2 should be about −50 volts to about −700 volts and typically about −500 volts to about −700 volts. This phase of the coating of the walls and electrodes is usually carried out for about 30 minutes to about 2 hours.

After the walls of the chamber and the electrodes are precoated with fluorocarbon film 13, the metal coated substrates 4 from the above processing upon which the fluorocarbon films are to be deposited are placed on working electrode 2 in the chamber to be cleaned and have any metal oxide removed from it by the reactive ion etching with $CF_4$.

For instance, carbon tetrafluoride gas is introduced into the chamber at a flow rate of about 10 to about 150 standard cubic centimeters per minute with a preferred flow rate of about 100 standard cubic centimeters per minute. The pressure during the $CF_4$ treatment is about 10 to about 150 mTorr and preferably about 15 to about 50 mTorr and most preferably about 25 mTorr. The applied radio frequency power is about 100 to about 1000 watts, preferably about 100 to about 400 watts and most preferably about 150 to about 300 watts. The time of the exposure is typically about 5 to about 60 seconds, an example of which is about 30 seconds. The self-bias on the working electrode is about −500 to about −700 volts.

The $CF_4$ gas can be supplied from gas source 22 via conduits 23 and 5. The flow rate can be controlled by valve 24 and monitored by linear mass flow meter 25.

The structure is then exposed to ion bombardment from a noble gas plasma. Examples of noble gases are argon, helium, neon and xenon. The preferred gases are argon and xenon. The ion-bombardment creates broken bonds to permit formation of metal-carbon strong bonding.

The argon plasma process can be carried out in the same type of apparatus described in copending U.S. patent application (DOCKET NO. Y0989-053), disclosure of which is incorporated herein by reference and illustrated in FIG. 1.

In particular, the coated substrate 4 from the above processing is placed in a chamber 1 which can be evacuated and wherein a working electrode 2 and a second electrode 3 are present in the chamber. The working electrode 2 is capacitively connected to a radio frequency power source 14. The electrode 3 is connected to ground. As discussed above, the walls and electrodes in the chamber are precoated with a polymeric fluorocarbon film 13 typically about 1 to about 5 microns thick. The gas, such as argon, is introduced into the chamber at a flow rate of about 10 to about 150 standard cubic centimeters per minutes with a preferred flow rate of about 100 standard cubic centimeters per minute. The pressure during this gas plasma treatment is about 10 to about 100 mTorr and preferably about 15 to about 50 mTorr and most preferably about 25 mTorr. The applied radio frequency power is about 100 to about 1000 watts, preferably about 200 to about 600 watts and most preferably about 300 to about 500 watts. The time of the exposure is typically about 0.25 to about 5 minutes and preferably about 1 to about 3 minutes, an example of which is 2 minutes. The self-bias on the working electrode 2 is about −400 to about −700 volts.

The gas, such as argon, can be supplied from the gas source 18 via conduits 19 and 5. The flow rate can be controlled by valve 20 and monitored by linear mass flow meter 21.

The polymeric fluorocarbon film is preferably provided by the technique disclosed in U.S. patent application Ser. No. 07/693,736 (DOCKET NO. Y0989-053), referred to hereinabove. It is most preferred that the polymeric fluorocarbon film be subsequently immediately deposited onto the treated substrate in the same apparatus employed for the above ion-bombardment treatment. In such event, it is preferred that the plasma treatment, such as the argon, be stopped by providing a flow of the fluorocarbon polymerizable gas in admixture with, for example, the argon for about 30 to about 120 seconds, an example of which is about 60 seconds, after which the argon flow is stopped. The treatment with both the gaseous polymerizable fluorocarbon and noble gas plasma allows for the deposition to begin under conditions where the metal broken bonds are available to form metal-carbon bonding. It is important to promote formation of carbide at this interface before the fluorocarbon polymerizes.

The flow of the polymerizable fluorocarbon gas is continued at a rate that is typically about 20 to about 150 standard cubic centimeters per minute and preferably about 100 standard cubic centimeters per minute which in the case of a reaction vessel of about 48 liters corresponds to a residence time of about 0.9 seconds of the gaseous fluorocarbon in the plasma chamber. Typical gaseous polymerizable fluorocarbons are $C_2F_4$, $C_4F_8$, $C_3F_8$ and $C_2F_6$, and preferably $C_2F_4$.

To facilitate understanding of the preferred technique for providing the polymeric fluorocarbon film, reference is made to FIG. 1. For instance, the plasma deposition of the polymeric fluorocarbon film can be carried out in a chamber 1 capable of being evacuated, which chamber contains a first working electrode 2 and a second electrode 3.

The working electrode 2 and the second electrode 3 can be fabricated from aluminum or quartz. The electrodes are held in place with struts (not shown). The working electrode is preferably water-cooled through conduit 30. The first working electrode 2 is capacitively connected to a radio frequency power source 14. Numeral 17 represents a ground shield, typically about 1 mil from the electrode to prevent sputtering of the electrode material during the deposition. The surface area of the working or first electrode 2 is typically less than preferably about 1/10 to about 1/2, and most preferably about 1/4 the combined surface area of the second electrode 3 and the interior walls of chamber 1. The second electrode is connected to ground. In a vacuum chamber having a volume of about 48 liters, the electrodes typically are spaced about 2 to about 10 inches apart and more typically about 8 inches apart. In a vacuum chamber having the above described dimensions, the electrodes have diameters of about 6 to about 18 inches and more typically about 12 inches to about 10 inches. The substrate upon which the film is to be deposited is represented by numeral 4 and is located adjacent to and supported by the working electrode 2. The walls of the chamber and surfaces of the electrodes as discussed above are coated with film of a fluorocarbon polymer 13. This is essential in assuring that the deposited fluorocarbon film is free from metallic contamination as well as assuring that the electrical properties of the discharge during the plasma coating are within the parameters necessary for achieving the desired film characteristics. The thickness of the fluorocarbon film 14 such as polytetrafluoroethylene on the walls of the chamber and the electrodes is typically about 1 to about 5 microns, preferably about 2 to about 5 microns, and most preferably about 2 to about 3 microns. In the event the film is too thin, contamination of the fluorocarbon film being deposited will not be prevented and the preferred electrical properties of the chamber during the deposition will not be maintained within the parameters required. On the other hand, if the layer is too thick, such will tend to lose its adhesion to the walls of the chamber thereby, causing particle contamination and pin holes in the polymeric fluorocarbon film being deposited.

The gaseous polymerizable fluorocarbon can be introduced into the chamber via the conduit 5. The chamber prior to introduction of the gas can be evacuated through vacuum coupling 6. The flow of the gas can controlled by valve 15 and measured by linear mass flow meter 16.

The gaseous fluorocarbon is typically fed into the chamber at a rate of about 20 to about 150 standard cubic centimeters per minute (sccm) and more typically at about 100 sccm which corresponds to a residence time of about 0.9 seconds of the gaseous polymerizable fluorocarbon in a plasma chamber having a volume of about 48 liters. Prior to introduction of the gaseous fluorocarbon into the chamber, the chamber is evacuated, for instance, using a turbo molecular pump to provide a vacuum of at least about $10^{-6}$ torr.

The amount of RF power that is supplied to the working electrode 2 is in the range of about 100 watts to about 1000 watts, more usually about 200 to about 800 watts and most usually about 200 watts to about 400 watts. The power density is typically about 0.05 to 0.4 W per $cm^2$ of the working electrode surface area and more typically about about 0.15 W per $cm^2$ of the working electrode surface area. The pressure during the deposition is maintained in the range of about 10 to about 180 mTorr and more typically at about 20 to about 100 mTorr and most typically about 26 mTorr. The radio frequency is typically about 1 to about 100 megahertz and more typically 13.56-MHz. The RF power is capacitatively fed to the working electrode using a matching network 31 which includes a D.C.-blocking capacitor in series with the working electrode to minimize reflected power. The self-bias voltage on the working electrode 2 is usually about −50 volts to about −700 volts and more usually about −500 volts to about −700 volts. The precoating of the walls of the chamber and the electrodes is instrumental in achieving the desired self-bias on the working electrode. This process by the judicious selection of the various process parameters results in achieving the unique properties of the fluorocarbon film by achieving energetic bombardment with ionized fluorocarbon fragments during the deposition. The energetic ion bombardment causes ion-enhanced etching of the film and gassifies the more volatile components of the growing film. Ion bombardment serves, therefore, to in situ remove, during growth, species which are inherently produced in the plasma and which would otherwise be incorporated in the growing film but which would adversely affect the properties of the deposited material. For instance, such would significantly reduce the thermal stability of the deposited film. The energy of the ions and the ion flux and accordingly the final properties of the fluorocarbon film depend on the pressure, power and self-bias voltage during the deposition. Films whereby high ion bombardment during deposition occur exhibit much better thermal stability than films deposited without or with very little ion bombardment.

Because of the difference between ion and electron mobilities in the plasma and since the working electrode is effectively electrically isolated and connected to the power generator across a blocking capacitor, a DC bias potential appears on the electrode. As a result of the DC bias potential, the working electrode and substrate are subjected to positive ions from the plasma. The positive ion bombardment tends to give rise to deposited films of relatively high density. Such high density films tend to resist taking up of oxygen from the air.

The films deposited, according to the above process, are normally deposited at a rate of about 30 nanometers/minute to about 50 nanometers/minute. The temperature of the substrate during the deposition is normally at about room temperature, but the energetic ion bombardment will cause some heating of the substrate during deposition. Accordingly, the substrate temperature during deposition will be from about normal room temperature to about 100 °C.

Fluorocarbon films deposited, pursuant to the above process, typically have a thickness of about 0.01 to about 5 microns, more typically about 0.02 to about 5 microns and preferably about 0.1 to about 1 microns.

These films exhibit predominantly C-CF$_x$ bonding (greater than 33% of the film) and have a fluorine/carbon ratio of about 1:1 to about 3:1 and preferably about 1:1 to about 1.8:1. The films are thermally stable (no loss in film thickness) when heated to at least 350° C. for at least 30 minutes in dry nitrogen. In addition, the dielectric constant of the film is a maximum of about 2.5, preferably about 1.9 to about 2.3 and most preferably about 1.9 to about 2.2. These films are highly crosslinked as contrasted to the linear polymer films obtained by bulk polymerization.

Also, the preferred films of the present invention are of relatively high density and stable in air resisting the take up of oxygen from the air. On the other hand, fluorocarbon materials prepared by prior art plasma procedures tend to be lower in density, which in turn, renders such susceptible to oxygen take up from the air. This, in turn, tends to increase the dielectric constant of the material to undesirably high levels and results in loss of adhesion.

The process as described herein provides for a tenacious bond between the substrate and polymeric fluorocarbon film. An alternative method for forming a tenacious bond between various substrates and polymeric fluorocarbon films employing an interlayer of silicon and/or a silicide is disclosed in our copending U.S. patent application Ser. No. 07/693,735 (DOCKET NO. Y0989-064).

The following non-limiting examples are presented to further illustrate the present invention.

EXAMPLE 1

A 5 inch copper substrate of about 2 microns thick supported by an underlying silicon wafer is coated with a 0.2 micron thick film of tantalum. The tantalum is coated onto the copper substrate by sputter deposition.

The coated copper substrate is then supported on a 16 inch aluminum working electrode in a stainless steel vacuum chamber of the type described above. The volume of the vacuum chamber is about 48 liters. The walls of the vacuum chamber and the electrodes are coated with polytetrafluoroethylene film at a thickness of about 3 microns. The working electrode is water-cooled and capacitively connected to a 13.56-MHz radio frequency power source using a matching network to minimize reflected power. The chamber is evacuated using a turbo molecular pump to a vacuum of at least $10^{-6}$.

Carbon tetrafluoride (CF$_4$) gas is introduced into the chamber at a flow rate of about 100 sccm and a RF power is applied to the working electrode at about 250 watts. The pressure in the chamber is about 25 mTorr. The CF$_4$ gas treatment is continued for about 30 seconds to clean the metal surface and remove any metal oxide from the surface.

Next, the cleaned surface is subjected to ion-bombardment by a Ar plasma. In particular, after the CF$_4$ gas is discontinued, argon gas is introduced into the chamber at a flow rate of about 100 sccm and a RF power is applied to the working electrodes at about 400 watts. The pressure in the chamber is about 26 mTorr. The argon gas treatment is continued for about 2 minutes which creates a number of broken bonds to allow formation of metal-carbon bonding.

The argon treatment is stopped by flowing C$_2$F$_4$ gas along with the argon gas at a rate of 100 sccm for about 60 seconds using the same conditions used for the argon. Then the argon flow is stopped. This overlap of the argon gas and fluorocarbon gas allows for the deposition of polymeric fluorocarbon to begin under conditions where tantalum broken bonds are available to form metal-carbon bonding.

The C$_2$F$_4$ feed is continued at the above conditions for about 20 minutes to provide a polymerized fluorocarbon film of about 0.6 microns thick.

The tenacity of the adhesion bond of the fluorocarbon film to the substrate is qualitatively determined employing an adhesive tape test whereby an adhesive tape is attached to the fluorocarbon film on the substrate. The adhesive tape is then pulled in an attempt to remove the fluorocarbon film from the substrate. However, fluorocarbon films deposited pursuant to this example could not be peeled off or removed employing the typical adhesive tape test confirming the tenacious bond achieved by the present invention. On the other hand, following the same procedure as employed in this example except for the tantalum precoating, CF$_4$ and argon treatment steps resulted in fluorocarbon film that could be peeled off from the substrate by the above adhesive tape test demonstrating that the fluorocarbon film in such instance adhered better to the adhesive tape than to the underlying copper substrate.

Films produced according to copending U.S. patent application Ser. No. 07/693,736 (DOCKET NO. Y0989-053) and Ta films which were not subjected to the above CF$_4$ and Ar and Ar/C$_2$F$_4$ plasma treatments did not pass the above adhesion test.

What is claimed is:

1. A method for adhering a polymeric fluorocarbon film to a substrate which comprises:
   coating said substrate with a non-volatile carbide-forming metallic layer;
   exposing the coated substrate to ion-bombardment in a noble gas atmosphere, introducing a gaseous polymerizable fluorocarbon into said noble gas atmosphere, thereby exposing said coated substrate to a mixture of said noble gas and said gaseous polymerizable fluorocarbon; and
   then exposing said coated substrate to a gaseous polymerizable fluorocarbon in the substantial absence of the noble gas to deposit a polymeric fluorocarbon film on the substrate.

2. The method of claim 1 wherein said substrate is selected from the group of silicon oxide, silicon nitride, copper, gold and nickel.

3. The method of claim 1 wherein said substrate is selected from the group consisting of copper, gold and nickel.

4. The method of claim 1 wherein said substrate is copper.

5. The method of claim 1 wherein said non-volatile metallic layer is selected from the group consisting of tantalum, titanium and tungsten.

6. The method of claim 1 wherein said non-volatile metallic layer is tantalum.

7. The method of claim 1 wherein the non-volatile metallic layer is about 0.05 to about 2 microns thick.

8. The method of claim 1 wherein the carbide-forming metallic layer is about 0.1 to about 0.5 microns thick.

9. The method of claim 1 which further includes cleaning the coated substrate by reactive ion etching after coating with said carbide-forming metallic layer and prior to exposing to the ion-bombardment.

10. The method of claim 9 wherein the reactive ion etching employs CF$_4$ gas.

11. The method of claim 1 wherein said ion bombardment is from an argon plasma.

12. The method of claim 11 which comprises providing an argon plasma in a chamber capable of being evacuated wherein the chamber includes a working electrode and the walls of the chamber and the electrode are coated with a polymeric fluorocarbon film, and wherein the working electrode is capacitively coupled to a radio frequency power source.

13. The method of claim 12 wherein the radio frequency power is applied at a power of about 100 watts to about 1000 watts, and the pressure is about 10 to about 180 mTorr.

14. The method of claim 13 wherein the flow rate of the argon is about 20 to about 150 sccm and the time of the argon plasma treatment is about 1 minutes to about 3 minutes.

15. The method of claim 12 wherein the pressure is about 26 mTorr, the power is about 100 to about 400 watts, the argon flow rate is about 100 sccm and the time of the argon plasma treatment is about 2 minutes.

16. The method of claim 1 wherein the gaseous polymerizable fluorocarbon is $C_2F_4$, and wherein a self-bias voltage of is about −50 to about −700 volts is employed during the deposition of the fluorocarbon film.

17. The method of claim 16 wherein the self-bias voltage is about −500 to about −700 volts.

* * * * *